United States Patent [19]

Morino et al.

[11] Patent Number: 4,641,773

[45] Date of Patent: Feb. 10, 1987

[54] ULTRASONIC STYLUS POSITION STABILIZER

[75] Inventors: Ronald Morino, Seacliff; Joseph A. Conti, Whitestone, both of N.Y.

[73] Assignee: Kollmorgen Technologies Corp., Dallas, Tex.

[21] Appl. No.: 763,982

[22] Filed: Aug. 9, 1985

[51] Int. Cl.⁴ .................. H01K 3/10; B23K 1/06; B23K 20/10
[52] U.S. Cl. ............................... 228/1.1; 29/850; 156/580.1
[58] Field of Search ............... 228/1.1; 29/850; 156/580.1, 580.2

[56] References Cited

U.S. PATENT DOCUMENTS 4,399,842 8/1983 Gibbons ........................ 29/850
4,450,623 5/1984 Burr ............................... 29/850

Primary Examiner—Nicholas P. Godici
Assistant Examiner—Samuel M. Heinrich
Attorney, Agent, or Firm—Morgan & Finnegan

[57] ABSTRACT

In a positioning guide for an ultrasonic stylus disposed in a scribing head, a hub surrounds the stylus and is secured to the stylus near its working tip. A surrounding retainer is secured to the housing of the moveable scribing head. Radial spokes secure the hub to the surrounding retainer, thereby providing a high degree of lateral rigidity and longitudinal compliance for the working tip of the stylus.

11 Claims, 7 Drawing Figures

ULTRASONIC STYLUS POSITION STABILIZER

BACKGROUND OF THE INVENTION

In the manufacture and assembly of electric and electronic units, the electronic components are commonly mounted on preformed circuit boards. The most common technique used in making circuit boards are the so called "printed circuit" techniques where conductor patterns are chemically etched or deposited on the surface of a substrate. Recently, however, techniques have been developed for making circuit boards by scribing or writing insulated wires on to the surface of the board. The advantages of the scribed technique are that the system can be computer controlled (eliminating the need for printing art work) and high density patterns can be created (due to virtually unlimited conductor crossovers).

The basic scribed wire technique is described in Burr Pat. No. 3,674,914. The insulated wire, as it is written or scribed, is fixed or tacked by a heat sensitive adhesive surface on the substrate by means of a scribing or tacking head. The head guides the wire and heats or energizes the sensitive surface as the wire is brought into engagement. The preferred technique for tacking the scribed wire is through the use of ultrasonic energy. The wire passes beneath a grooved stylus which is used to position the wire. Ultrasonic energy is applied to the stylus to activate the adhesive layer beneath the wire and to push the wire into the adhesive layer. After the tacked or scribed wire pattern is complete on the board surface, the pattern is fixed by coating the board with an encapsulating layer. Thereafter, holes are drilled in the board at the conductor run terminations and the holes then plated to provide for surface connections to electronic components.

The Burr '914 patent discloses a system suitable for making discrete wired interconnection boards for the dual-in-line integrated circuits which have been in common use for many years. The standard pin spacing for these integrated circuits is 100 mil. Interconnection boards for this pin spacing are made using No. 34 AWG wire having a 0.0063 inch (6.3 mil) diameter. Plated holes for providing surface connections and for accommodating component lead wires are on the order of 46 mil. With these parameters conductor displacement errors as great as 16 mil can be tolerated without faults resulting from missing the conductor or connecting to the wrong conductor during the drilling operations.

Because of the small wire size, the energy required, and the available space within the scribing head, the ultrasonic stylus is preferably energized by magnetostriction and is relatively long and narrow. Since the nodal points where the stylus can be rigidly held are at least several inches from the working tip of the stylus, additional positioning stability is needed near the working tip. In the past, additional positioning stability was provided by means of a Teflon bushing with a 1 mil clearance to permit longitudinal vibration of the stylus. With this arrangement the ultrasonic stylus could position the scribed wires with sufficient accuracy for making the dual-in-line circuit boards with the 100 mil pin spacing.

SUMMARY OF THE INVENTION

In recent times the electronics industry has moved toward more compact integrated circuit packages with surface mounted terminals. With the new packaging the distance between adjacent edge connections is 20 mil or less. Not only are the connection points closer together but the density of the wiring pattern must also be substantially increased. To achieve the increased density the wire size must be finer and is preferably 42 AWG wire with a 2.5 mil diameter. The hole diameter for surface terminals are preferably reduced to about 8 mil diameter and achieved through laser drilling. The misalignment error that can be tolerated (i.e., tolerance permitted before a hole either misses the intended conductor or hits the wrong conductor) is reduced from 16 mil to about 5 mil or less. For corner connections (i.e., surface connection to a conductor at a point where it makes a 90° bend) the clearance is reduced from about 18 mil to approximately 3 mil.

A general object of the invention is to provide for greater positioning accuracy of an ultrasonic stylus such as may be used in creating circuit boards.

A more specific object is to provide an ultrasonic stylus for scribing wires in a dense conductor pattern in circuit boards suitable for use with pin spacings of 20 mil or less.

The problems resulting from a reduction in tolerances as indicated above is much greater than indicated by the numerical decreases. Registration of the conductor pattern must be maintained over the entire circuit board which can often include several thousand terminal connections. Since conductor locations are determined by an X-Y, head positioning errors tend to be cumulative. The head movement is bi-directional and therefore errors due to stylus misalignment tend to multiply. In other words, if the stylus is to the left of the desired position when the head moves upwardly, the stylus will be to the right of the desired position when the head moves downwardly and, hence, the relative misalignment error is doubled. Similarly, in creation of two-sided boards a misalignment error in one direction on one side of the board becomes a misalignment error in the opposite direction on the other side of the board when the board is inverted to form the second side.

The prior technique for positioning the ultrasonic stylus using a Teflon bushing with a 1 mil clearance to provide longitudinal movement does not provide the necessary positioning accuracy. Furthermore, the bushing tends to wear rapidly increasing the registration errors with time. Even with the most careful alignment, bushing replacement and complete realignment of the system would be necessary on an almost daily basis.

The stylus positioning guide according to the invention virtually eliminates lateral displacement of the stylus while at the same time permitting a high degree of longitudinal compliance so as to not interfere with the ultrasonic vibration. A hub is secured surrounding the stylus near the working tip. A surrounding retainer is secured to the housing of the movable scribing head. Radial spokes secure the hub to the surrounding retainer. Preferably the radial spokes are formed by two or more wire loops held in tension. This arrangement has been found to provide an exceptionally high degree of lateral rigidity and, at the same time, provide a high degree of longitudinal compliance over the short distances required for ultrasonic vibration.

BRIEF DESCRIPTION OF THE DRAWINGS

The foregoing and other objects of the invention will become apparent from the following detailed specification which includes the drawings as follows.

DETAILED DESCRIPTION OF THE INVENTION

Figure 1:
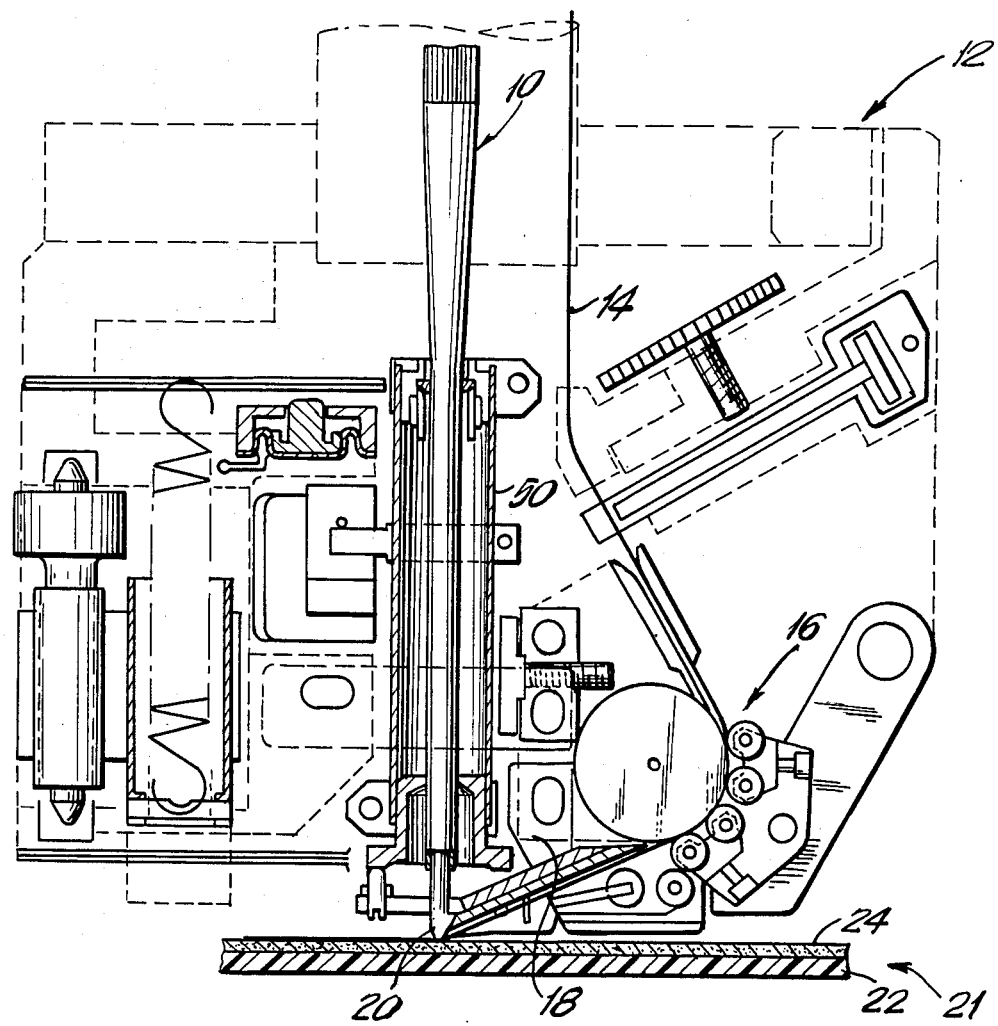
FIG. 1 is a cross sectional view of a scribing head for making wired circuit boards, the scribing head including an ultrasonic stylus with the position stabilizing guide according to the invention.

In a preferred embodiment of the invention an ultrasonic stylus 10 is mounted in the scribing head 12 shown generally in FIG. 1. Insulated wire 14 is dispensed from a spool (not shown) and is supplied to the surface of a circuit board 21 via a wire feed drive system 16. The wire emerging from the wire feed mechanism passes a wire cutter 1B and then passes beneath a groove in a tool 20 attached to the working end of stylus 10. The circuit board 21 being formed is mounted on an X-Y table which positions the circuit board relative to scribing head 12. The circuit board includes a substrate 22 coated with an adhesive surface 24 which is activatable by the application of ultrasonic energy. As the wire passes beneath tool 20 of the ultrasonic stylus, ultrasonic energy is applied to activate the adhesive layer on the circuit board and to guide the wire in place in adhesive. The general arrangement of the scribing head in combination with the X-Y table, and the control of the scribing head and table movements is set forth in application Ser. No. 823,153; filed 8/9/77, "Methods and Apparatus For Making Scribed Circuit Boards", by R. P. Burr et al. The table is capable of moving in any one of four directions, i.e., right, left, up and down. The scribing head is rotatable to dispense wire in any one of four directions corresponding to the current direction in which the table is moving.

Figure 2:
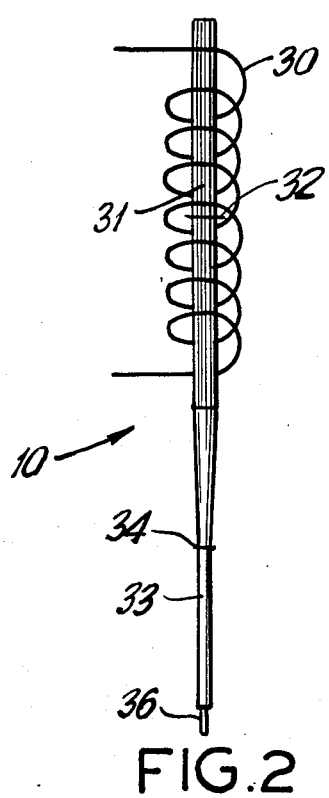
FIG. 2 is a diagrammatic illustration of the ultrasonic stylus used in combination with the position stablizing guide of the invention.

Stylus 10 is generally shaped as shown in FIG. 2 including a magnetostrictive transducer 31 coupled to a tapered horn 33. Transducer 31 is made from a material having magnetostrictive properties, such as nickel, and is surrounded by a driving coil 30. Preferably the transducer portion of the stylus is longitudinally laminated to reduce eddy current losses. The length of the transducer is equal to one half the wave length of the energizing frequency applied to the driving coil. The ultrasonic stylus for making scribed circuit boards according to the invention uses a preferred frequency of 25 kilohertz.

The magnetic flux produced by energization of the drive coil causes the magnetic material in the transducer to contract. The contraction is a function of the flux intensity and is independent of flux direction. The nodal point 32 at the center of transducer 31 is stationary and the ends of the transducer vibrate in a longitudinal direction relative thereto.

Horn 33 of the stylus is attached to one end of the transducer by brazing and serves to amplify the ultrasonic vibration of the transducer. The horn is constructed from a nonmagnetic material which is reasonably hard and capable of withstanding considerable stress. Materials such as titanium or Monel alloys are suitable for construction of the horn. A tool 36 is attached to the working end of horn 33. The tool is preferably made from a hard tungsten carbide material shaped in accordance with the needs of the operation being performed. As can be better seen in FIG. 4, the tool includes a groove 38 at the working end which is dimensioned to accommodate the wire being scribed to the surface of the circuit board being manufactured.

The horn as shown in FIG. 2, is acoustically coupled to the transducer and couples the ultrasonic vibration to tool 36. The taper of the horn increases the amplitude of vibration at the tool end. By suitable dimensioning of the horn the amplitude of vibration can be doubled.

The horn also has a nodal point 34 which is located at a mid-point but due to the taper of the horn, is somewhat closer to the transducer than to the tool end. The exact nodal point is located experimentally by observing the stylus when energized.

Since the stylus is stationary at the nodal point, the nodal point can be used to rigidly secure the stylus. As can be seen from FIG. 2, however, nodal point 34 is located at a considerable distance from 36 and is connected only by a relatively small diameter portion of the tapered horn. As will be described hereinafter in more detail a position stablizing guide is therefore required near the tool in order to accurately control the positioning of very fine wires in the manufacture of scribed circuit boards.

Figure 3:
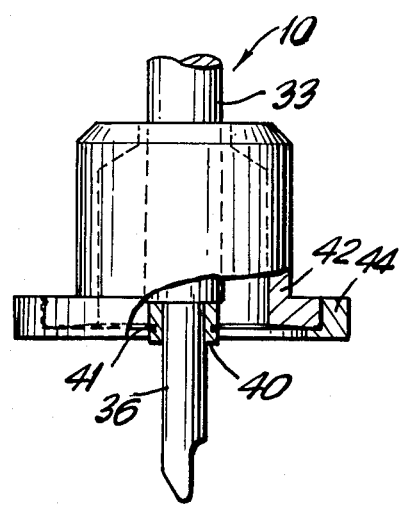
FIGS. 3 and 4 are elevation and plan views respectively of the position stablizing guide according to the invention.
Figure 4:
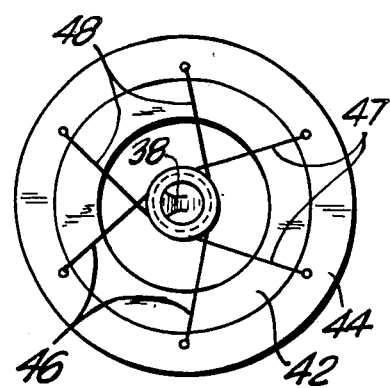

The position stablizing guide for the working end of the stylus is shown in FIGS. 3 and 4. A hub 40 is maintained surrounding tool 36 adjacent the end of horn 33 of stylus 10. The hub is surrounded by a flanged bushing 42 which acts as a retainer configured for mounting in the non-vibratory portion of the scribing head housing. Hub 40 is maintained in position relative to the retainer by three wire loops 46-48 spaced 120° from one another. Each of the wire loops begins at the retainer, passes around the hub in a groove 41, and then returns to the retainer. Groove 41 is preferably formed in hub 40, but could be formed integral with the stylus. The wire loops are preferably made using four mil diameter, steel "music" wire maintained under tension of about four pounds.

Preferably, brazing, welding and soldering are avoided in attaching the wires of the position stabilizing guide since the heat involved in such operations tends to anneal the wire altering the strength characteristics. The retainer bushing 42, as shown in FIGS. 3 and 4 is surrounded by a retaining ring 44 which is pressed over bushing 42 to provide a force fit rigidly affixing the wires to the retainer. The completed positioning guide includes six generally radial spokes coupling the hub, which vibrates at ultrasonic frequencies with the stylus, to the retainer, which is attached to the scribing head housing that does not vibrate. The positioning guide can accommodate, on a continuous duty basis, vibration excursion of approximately one mil under load.

Figure 5:
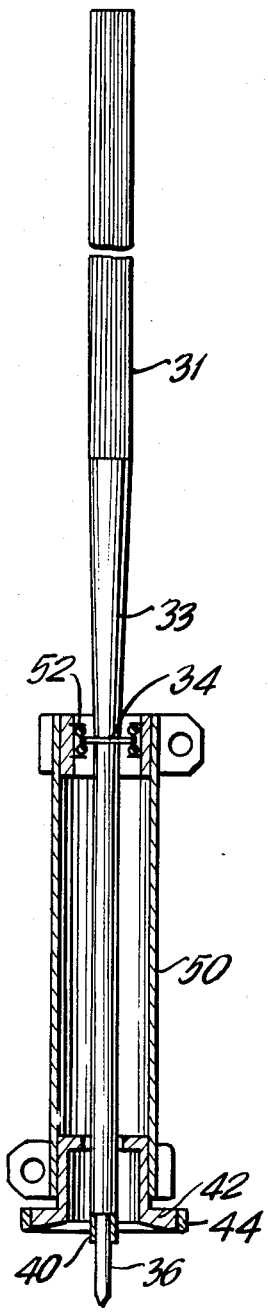
FIG. 5 is an illustration of the stylus with the position stablizing guide in place.

As shown in FIG. 5, the position stabilizing guide is mounted in a non-vibrating sleeve 50 secured to the scriber housing 12 (FIG. 1). The stylus is also secured to sleeve 50 by a pair of "O" rings 52 and a brazed collar surrounding the stylus at nodal point 34. With this arrangement the lateral compliance of the positioning guide permits a longitudinal ultrasonic movement at the working end, i.e., at tool 36. At the same time, however, there is virtually no lateral movement of the tool relative to sleeve 50 which in turn is securely affixed to the scribing head.

Figure 6:
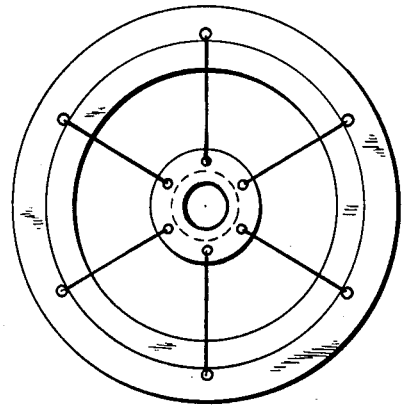
FIG. 6 illustrates an alternative structure for the position stabilizing guide.

FIG. 6 illustrates another structure wherein individual wire spokes are formed by attaching wires both at the hub and at the retainer rather than using wire loops. Preferably, attachment of the wires is by means of a forced fit rather than by operations such as brazing or welding which require heating. The surface area of the stabilizing guide near the hub should be kept at a minimum since the hub is vibrating at ultrasonic frequencies. Vibration moves the surrounding air and, thus, is acoustically coupled to the surrounding medium. If the surface area of the stabilizing guide near the hub is not minimized, such as by means of the spokes previously described, considerable energy is dissipated and hazardous or undesirable sonic environmental conditions are created.

Figure 7:
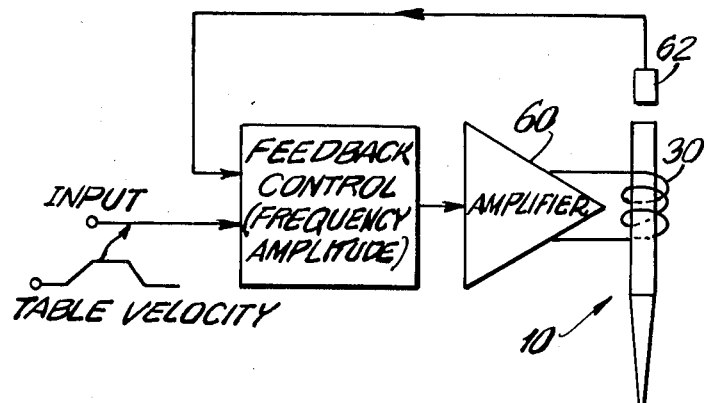
FIG. 7 is a schematic diagram of the circuit usable for energizing the driving coil for the ultrasonic stylus.

FIG. 7 is a schematic diagram illustrating a circuit suitable for energizing the ultrasonic stylus. An amplifier 60 is connected to driving coil 30 surrounding the transducer of the ultrasonic stylus. A microphone 62 picks up the vibration frequency and is used to provide a feedback signal which maintains oscillation at the resonant frequency of the transducer. The microphone is coupled to a feedback control circuit 64 which determines both the frequency and amplitude of the drive signal supplied to driving coil by amplifier 60. Feedback control circuit 64 also receives a signal indicating the table velocity. As indicated in FIG. 7 the amplitude of the driving signal, and hence, the amplitude of the ultrasonic vibration applied to the circuit board, is controlled as a function of the table velocity. In the formation of circuit boards, if the ultrasonic energy is not carefully controlled, the copper wire is cold worked and is likely to break. To avoid these problems, the amplitude of the ultrasonic vibration is modulated as a function of table velocity.

Although only a few embodiments of the invention have been described in detail, it should be obvious that there are numerous other variations within the scope of the invention. The invention is more particularly defined in the appended claims.

We claim:

1. A positioning guide for stabilizing the lateral position of an ultrasonic stylus relative to a housing, the housing being positionable relative to a workpiece, comprising:

a stylus including a working tip;
   a source of ultrasonic energy coupled to said stylus to cause longitudinal vibration therein;
   means forming a hub secured to said stylus near said working tip;
   a retainer secured to the housing;
   a plurality of spokes extending generally radially and secured between said hub and said retainer to provide lateral rigidity and longitudinal compliance for said working tip of said stylus relative to the housing.

2. A positioning guide according to claim 1 wherein said spokes are wires under tension.

3. A positioning guide according to claim 1 wherein said spokes are formed by wire loops extending from said retainer and around said stylus.

4. A positioning guide acoording to claim 3 wherein said hub includes a groove and wherein said wire loops are located in said groove.

5. A positioning guide according to claim 3 wherein said hub is integral with said stylus.

6. A positioning guide according to claim 3 wherein the ends of said wire loops are secured to said retainer under tension by a force fit.

7. A positioning guide for stabilizing the lateral position of an ultrasonic stylus relative to a housing, the housing being positionable relative to a workpiece; comprising:

a stylus including a working tip;
   a source of ultrasonic energy coupled to said stylus to cause longitudinal ultrasonic vibration therein;
   means providing a groove surrounding said stylus near said working tip;
   a retainer secured to the housing;
   a plurality of wire loops, each of said wire loops being located in said groove with the ends secured to said retainer maintaining the wire of said loops under tension.

8. A positioning guide according to claim 7 including three wire loops displaced from one another by 120°.

9. A positioning guide according to claim 7 wherein said groove is in a hub secured to said stylus.

10. A positioning guide according to claim 7 wherein said groove is in said stylus.

11. A positioning guide according to claim 7 wherein the ends of said wire loops are secured to said retainer by a force fit.

* * * * *